(12) United States Patent
Sopori et al.

(10) Patent No.: US 8,895,416 B2
(45) Date of Patent: Nov. 25, 2014

(54) SEMICONDUCTOR DEVICE PN JUNCTION FABRICATION USING OPTICAL PROCESSING OF AMORPHOUS SEMICONDUCTOR MATERIAL

(71) Applicants: Alliance for Sustainable Energy, LLC, Golden, CO (US); Applied Optical Sciences (AOS) Corp, Rancho Palos Verdes, CA (US)

(72) Inventors: Bhushan Sopori, Denver, CO (US); Anikara Rangappan, Rancho Palos Verdes, CA (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 13/793,626

(22) Filed: Mar. 11, 2013

(65) Prior Publication Data

US 2014/0256080 A1    Sep. 11, 2014

(51) Int. Cl.

| | |
|---|---|
| *H01L 21/26* | (2006.01) |
| *H01L 21/205* | (2006.01) |
| *H01L 21/203* | (2006.01) |
| *H01L 31/18* | (2006.01) |
| *H01L 21/324* | (2006.01) |
| *H01L 31/00* | (2006.01) |
| *H01L 21/02* | (2006.01) |
| *H05B 3/00* | (2006.01) |

(52) U.S. Cl.
CPC ....... *H01L 31/1804* (2013.01); *H01L 21/02433* (2013.01); *H01L 21/02381* (2013.01); *H01L 21/0262* (2013.01); *H01L 21/02592* (2013.01); *H01L 21/324* (2013.01); *H05B 3/0047* (2013.01); *H01L 21/02609* (2013.01)

USPC ................. 438/487; 117/4; 438/795; 438/57; 438/69; 257/E21.328

(58) Field of Classification Search
USPC ......................................... 438/795
See application file for complete search history.

(56) References Cited

U.S. PATENT DOCUMENTS

| | | |
|---|---|---|
| 5,223,453 A | 6/1993 | Sopori |
| 5,429,985 A | 7/1995 | Sopori |
| 5,452,396 A | 9/1995 | Sopori |
| 5,577,157 A | 11/1996 | Sopori |
| 5,627,081 A | 5/1997 | Tsuo et al. |
| 5,693,520 A | 12/1997 | Branner et al. |

(Continued)

OTHER PUBLICATIONS

Sopori et al., "Using Silicon Injection Phenomenon During Fire-Through Contact Formation to Improve Process Control and Performance of Screen-Printed Multicrystalline-Silicon Solar Cells," 35tth Proceed. IEEE PVSC, Jun. 20-25, 2010, Hawaii, pp. 1-4.

*Primary Examiner* — Colleen A Matthews
*Assistant Examiner* — Regan J Rundio
(74) *Attorney, Agent, or Firm* — John C. Stolpa; Michael McIntyre

(57) ABSTRACT

Systems and methods for semiconductor device PN junction fabrication are provided. In one embodiment, a method for fabricating an electrical device having a P-N junction comprises: depositing a layer of amorphous semiconductor material onto a crystalline semiconductor base, wherein the crystalline semiconductor base comprises a crystalline phase of a same semiconductor as the amorphous layer; and growing the layer of amorphous semiconductor material into a layer of crystalline semiconductor material that is epitaxially matched to the lattice structure of the crystalline semiconductor base by applying an optical energy that penetrates at least the amorphous semiconductor material.

24 Claims, 9 Drawing Sheets

(56) References Cited

U.S. PATENT DOCUMENTS

| | | |
|---|---|---|
| 5,897,331 A | 4/1999 | Sopori |
| 5,928,438 A | 7/1999 | Salami et al. |
| 6,201,261 B1 | 3/2001 | Sopori |
| 6,852,371 B2 | 2/2005 | Sopori |
| 7,601,215 B1 | 10/2009 | Wang et al. |
| 7,645,337 B2 | 1/2010 | Im et al. |
| 7,670,885 B2 | 3/2010 | Mitsuhashi |
| 7,811,900 B2 | 10/2010 | Henley |
| 8,012,861 B2 | 9/2011 | Im |
| 8,048,221 B2 | 11/2011 | Stoddard |
| 8,110,480 B2 | 2/2012 | Henley |
| 8,178,221 B2 | 5/2012 | Goyal |
| 8,183,081 B2 | 5/2012 | Weidman et al. |
| 8,241,941 B2 | 8/2012 | Dubois et al. |
| 8,309,446 B2 | 11/2012 | Weidman et al. |
| 2005/0239293 A1* | 10/2005 | Cui et al. ............... 438/778 |
| 2005/0252544 A1 | 11/2005 | Rohatgi et al. |
| 2006/0208257 A1 | 9/2006 | Branz et al. |
| 2007/0169685 A1 | 7/2007 | Stoddard |
| 2008/0241986 A1 | 10/2008 | Rohatgi et al. |
| 2010/0159676 A1* | 6/2010 | Lieten ............... 438/487 |
| 2010/0192838 A1 | 8/2010 | Stoddard |
| 2010/0193016 A1 | 8/2010 | Fernandez et al. |
| 2010/0193031 A1 | 8/2010 | Stoddard |
| 2010/0193989 A1 | 8/2010 | Stoddard |
| 2011/0003485 A1* | 1/2011 | Sopori ............... 438/795 |
| 2011/0065264 A1* | 3/2011 | Moffatt et al. ............ 438/487 |
| 2011/0146782 A1 | 6/2011 | Gabor et al. |
| 2011/0197960 A1* | 8/2011 | Pham et al. ............ 136/256 |
| 2011/0277682 A1* | 11/2011 | Rana et al. ............ 117/200 |
| 2012/0037066 A1 | 2/2012 | Stoddard |
| 2012/0042947 A1 | 2/2012 | Stoddard |
| 2012/0090537 A1 | 4/2012 | Stoddard |
| 2013/0087195 A1* | 4/2013 | Hovel ............... 136/259 |

* cited by examiner

SEMICONDUCTOR DEVICE PN JUNCTION FABRICATION USING OPTICAL PROCESSING OF AMORPHOUS SEMICONDUCTOR MATERIAL

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

Photovoltaic solar cells are semiconductor devices comprising at least one PN Junction formed typically by taking a semiconductor wafer (such as a p-type Silicon (Si) wafer, for example) and employing a diffusion process (such as an n-type phosphorus diffusion process, for example) to apply a thin layer of dopant source material (such as $P_2O_5$, for example) onto the semiconductor wafer. After a desired amount of dopant is deposited the dopant source is removed, and the dopant is diffused deeper into the wafer, for example, by using a high-temperature (e.g., 800-900° C.) limited-source diffusion "drive-in" step. In all, the process can take 20-30 minutes to produce the desired PN Junction within the semiconductor wafer. As competition in the solar cell industry grows, market forces are driving manufacturers to find less expensive and faster methods for producing solar cells. As will become evident from studying the disclosure provided herein, there is a need in the art for improved systems and methods for fabricating PN junctions for solar cells and other semiconductor devices.

The foregoing examples of the related art and limitations related therewith are intended to be illustrative and not exclusive. Other limitations of the related art will become apparent to those of skill in the art upon a reading of the specification and a study of the drawings

BRIEF DESCRIPTION OF THE DETAILED DRAWINGS

Exemplary embodiments are illustrated in referenced figures of the drawings. It is intended that the embodiments and figures disclosed herein are to be considered illustrative rather than limiting.

DETAILED DESCRIPTION

Figure 1A:
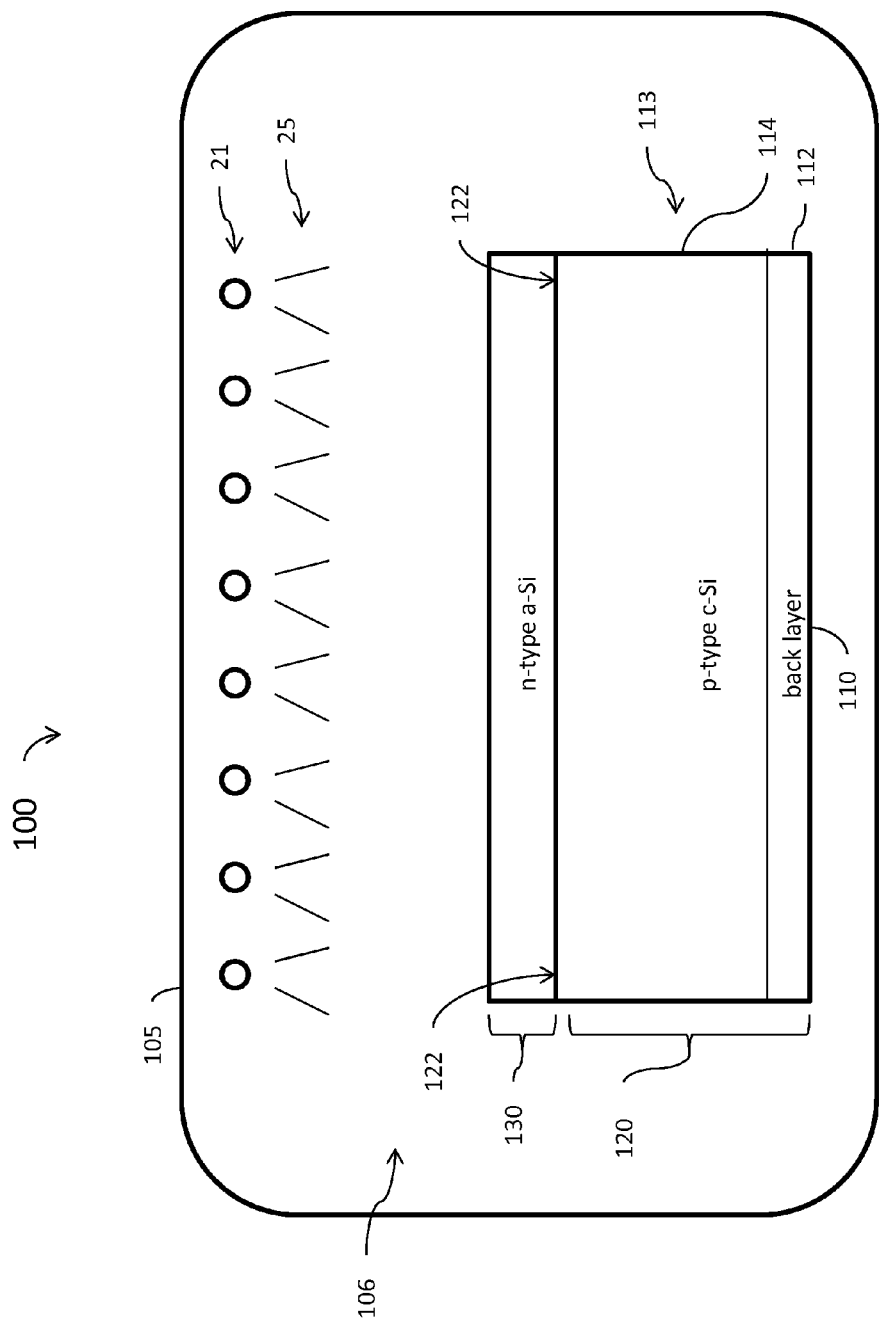
FIGS. 1A-1C are diagrams illustrating a process for fabricating a semiconductor device within an optical furnace of one embodiment of the present disclosure.

Embodiments of the present disclosure provide for semiconductor device fabrication techniques which enable production of crystalline PN junctions within semiconductor wafers in a significantly shorter time frame than conventional-traditional diffusion processes. In accordance with common practice, in the Figures, the various described features are not drawn to scale but are drawn to emphasize relevant features. Reference characters denote like elements throughout Figures and text.

In one or more embodiments, fabrication of crystalline PN junctions is accomplished by applying a layer of amorphous semiconductor material onto a crystalline semiconductor base material, and optically processing the combination to produce a lattice matched PN junction device. For example, in one embodiment, an n-type amorphous semiconductor material is applied onto a surface of a p-type crystalline semiconductor base material. In another embodiment, a p-type amorphous semiconductor material may be applied onto a surface of an n-type crystalline semiconductor base material. Using the optical process described below, the amorphous semiconductor material will grow into a crystalline form having a lattice structure that matches the lattice structure of the underlying crystalline semiconductor base material. Through the techniques described in this disclosure, a PN junction may be formed within a relatively very short period of time (within about 1 minute, for example). In some embodiments, the techniques may include multiple integrations resulting in semiconductor devices having multiple distinct PN junctions, including multijunction solar cells, NPN or PNP devices, or other more complex devices with layers of different doping types or doping levels.

FIG. 1A is a simplified diagram illustrating generally at 100 a semiconductor wafer 110 of one embodiment of the present disclosure. In this embodiment, semiconductor wafer 110 includes a crystalline semiconductor base 120 comprising crystalline Silicon (referred to herein as "c-Si"). In alternate implementations, crystalline semiconductor base 120 may comprise a multi-crystalline structure. Semiconductor wafer 110 further comprises a layer 130 of amorphous semiconductor material deposited to a surface 122 of crystalline semiconductor base 120. In this embodiment, amorphous semiconductor material 130 comprises amorphous Si (referred to herein as "a-Si"). For the purposes of this example, crystalline semiconductor base 120 is a p-type material and the amorphous semiconductor material layer 130 is an n-type a-Si material. In other embodiments, crystalline semiconductor base 120 may be an n-type material while a-Si layer 130 is a p-type material. In alternate implementations, the a-Si layer 130 material may be deposited using one of several methods, such as but not limited to: electron beam deposition, Plasma-enhanced chemical vapor deposition (PECVD), sputtering, or hot-wire chemical vapor deposition (HWCVD). In yet other implementations, other deposition procedures may be utilized.

In some embodiments, the starting material for semiconductor base 120 is a p-type wafer with a boron diffusion to form a P+ back surface back layer 112. Alternately, a P+ surface can be produced for wafer 110 by depositing a thick Al layer (typically 1 to 10 microns in thickness) onto base 120 and alloying this back layer 112 during the optical processing (described below). The advantage of having one or more such back layers is to prevent in diffusion of any traces of contamination from the optical furnace 105 during processing. These back layers are typically part of a conventional silicon solar cell.

Semiconductor wafer 110 is exposed to optical energy 25 having a prescribed and controlled intensity profile (discussed below) which results in uniform temperature distribution across semiconductor wafer 110 and more specifically across the surface 122 forming the initial interface between a-Si and c-Si material. In one implementation, a semiconductor wafer 110 is optically processed within a chamber 106 of an optical furnace 105 such as described and disclosed in any of U.S. Pat. No. 5,577,157 (entitled "Optical Processing Furnace with Quartz Muffle and Diffuser Plate" issued Nov. 19, 1996), U.S. Pat. No. 6,852,371 (entitled "Metal Processing for Impurity Gettering in Silicon" issued Feb. 8, 2005), and US Patent Publication 2011/003485 (entitled "Optical Cavity Furnace for Semiconductor Wafer Processing" published Jan. 6, 2011), which are each incorporated herein by reference in their entirety. In such an implementation, optical processing could be performed one wafer at a time, in discrete batches of multiple wafers, or in a continuous conveyor-belt configuration, depending on the holding capacity of the optical furnace being used. Light sources 21 within the furnace would be controlled to achieve the desired intensity profile.

Figure 1B:
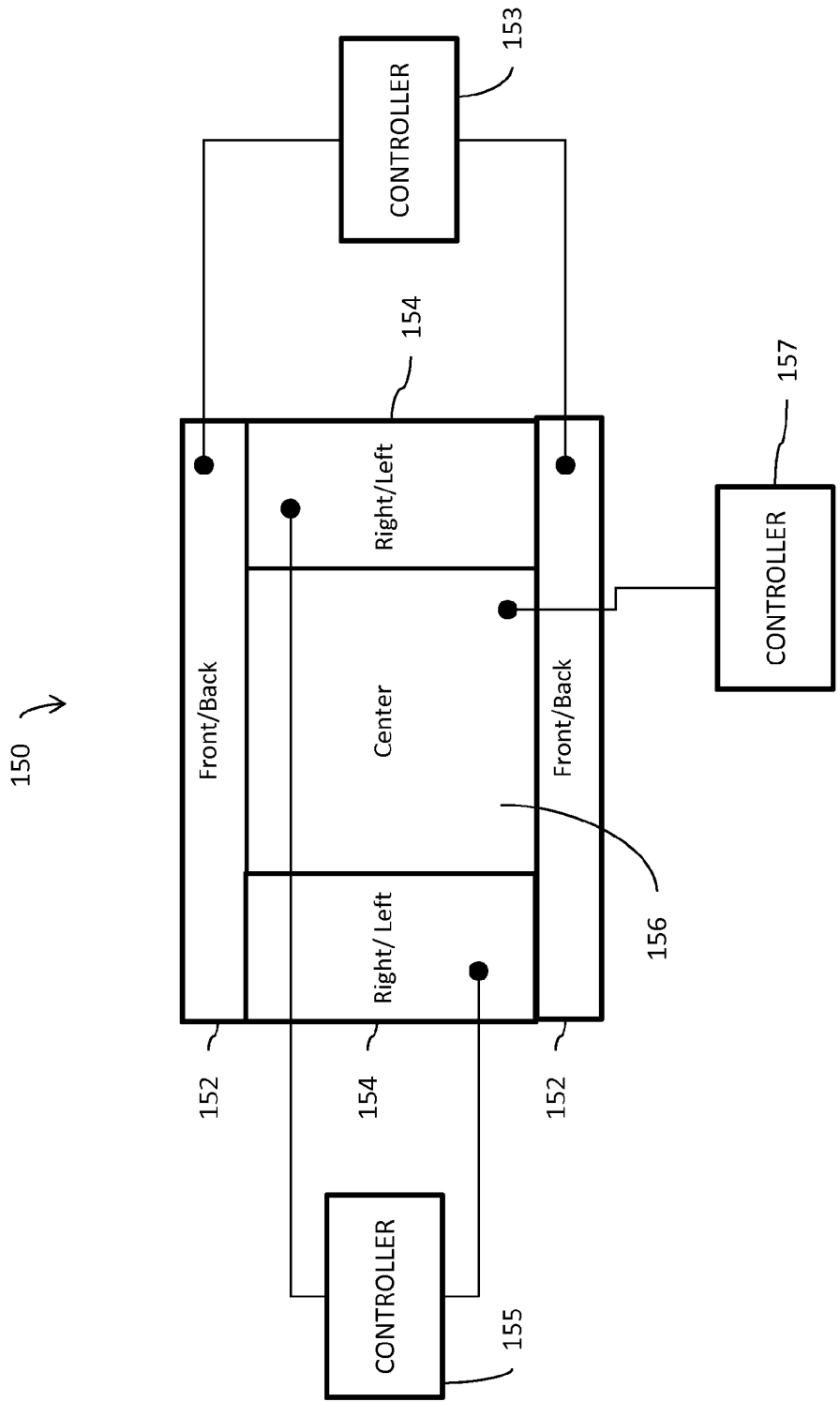

In one embodiment, within optical cavity furnace 105, the light sources 21 are segmented into three regions 152, 154 and 156, such as shown in FIG. 1B. In FIG. 1B, region 152 is designated "Front/Back", region 154 is designated "Right/Left" and region 156 is designated "Center." One of ordinary skill in the art would recognize that other implementations may comprise alternate configurations and/or segmentations of light sources 21. In the implementation shown in FIG. 1B, each of the regions 152, 154 and 156 have an associated controller (shown as respective controllers 153, 155 and 157) which regulate and control the power delivered to the light sources 21 within the respective regions. The power delivered by the controllers 153, 155 and 157 to light sources 21 is coordinated to provide an optical flux within optical cavity furnace 105 that produces a uniform temperature over wafer 110.

Figure 1C:
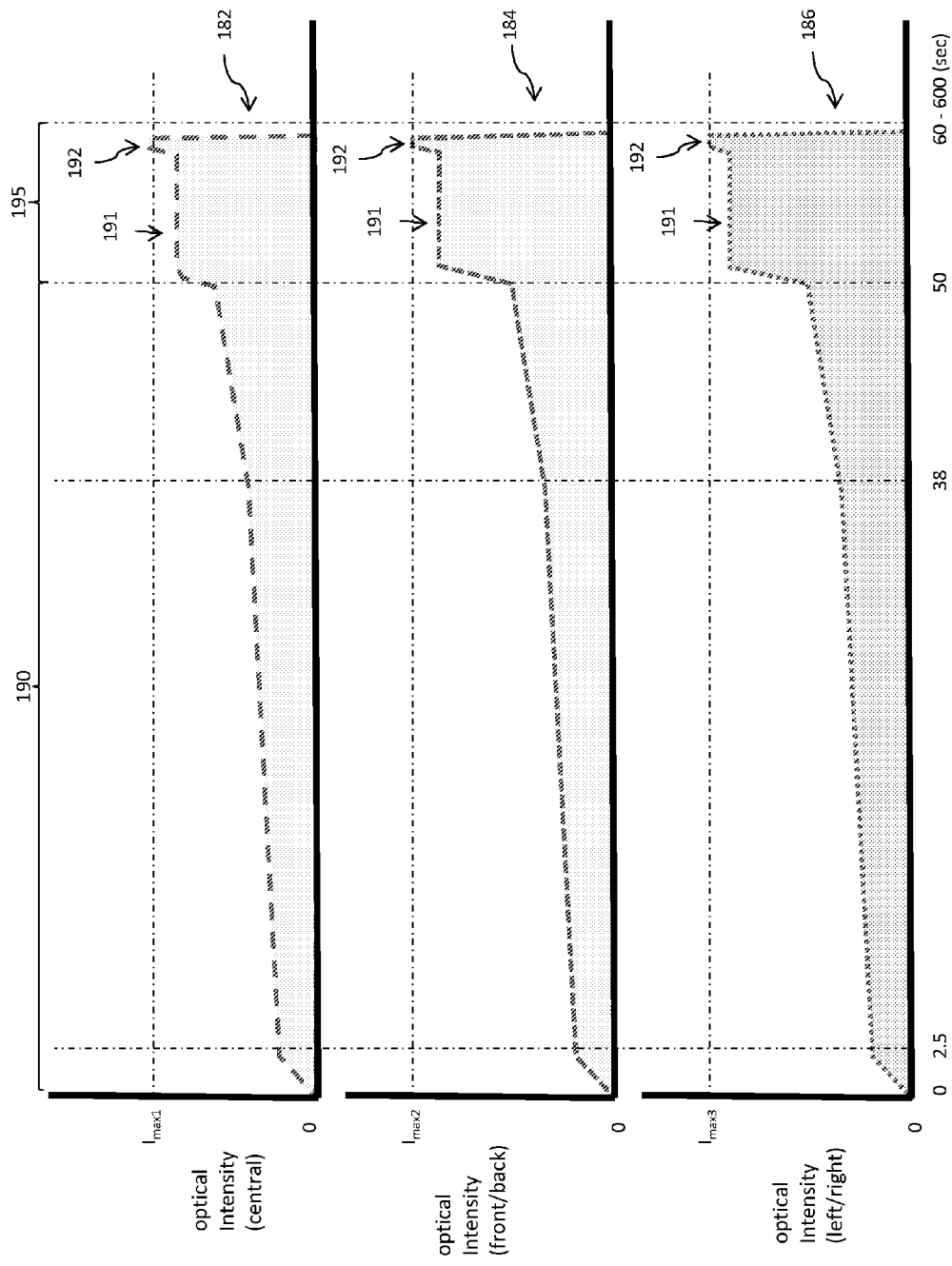

FIG. 1C illustrates one implementation of a set of time verses optical power profiles at 182, 184 and 186 provided by light sources 21. That is, controller 153 controls power to light sources 21 in region 152 such that the optical energy 25 they output conforms to optical power profile 182. Controller 155 controls power to light sources 21 in region 154 such that the optical energy 25 they output conforms to optical power profile 184. Controller 157 controls power to light sources 21 in region 156 such that the optical energy 25 they output conforms to optical power profile 186. In order to tailor the light sources to these profiles, voltages provided by the respective controllers 153, 155 and 157 are proportional to the power delivered to the light sources 21.

The particular profiles 182, 184 and 186 are tailored so that light sources 21 provide an optical flux within optical cavity furnace 105 that produces a uniform temperature over wafer 110. These particular profiles are about 60 to 600 seconds in total duration and have a "ramping stage" 190 shaped to gradually ramp up temperature, followed by a "high-intensity stage" 195 which then increase optical flux in one or more step changes to the intended maximum intensity for each region (i.e., $I_{max1}$, $I_{max2}$, and $I_{max3}$). The ramping stage 190 provides a gradual warm up in order to minimize localized thermally induced stresses and maintain a temperature at the interface below that at which liquidation of the semiconductor material (e.g. Si) occurs. In the "high-intensity stage" 195, the optical power is then increased rapidly to apply the target maximum intensity for a sufficient period of time to permit the amorphous semiconductor material to grow into a crystalline layer.

The specific time intervals and optical power levels in the profile will be selected based on experience and a number of parameters, such as the thickness of the substrate 120 and the type and thickness of the amorphous semiconductor material layer 130. That is, the duration and the amplitude of the light intensity depend on the thickness of the amorphous film and the structure of the base wafer (e.g., surface morphology or the presence of Al as a back layer on the wafer), and the wafer thickness. For example, where an a-Si layer 130 is applied onto substrate 120 as a 0.4 micron film, the duration of the ramping stage 190 would be sufficient to provide a gradual warm up. High-intensity flux during high-intensity stage 195 would be of sufficient duration to transforms the entire 0.4 microns of a-Si to c-Si as well as to permit the alloying of a back layer 112 (such as an Al back layer, for example). Epitaxial growth of the a-Si occurs at a first temperature applied during high-intensity stage 195 (shown in FIG. 1C at 191). Then a second increase in power determines a temperature of the alloy melt (e.g., Si—Al melt), which may be based on a temperature expected to obtain the highest dopant concentration of Al at the back surface field.

For some embodiments, the dopant concentration (for example, a phosphorous dopant) of the a-Si layer 130 is adjusted such that upon crystallization the sheet rho of the crystallized layer is the desired value. For most applications, particularly for solar cell, the sheet rho of the crystallized layer is typically in the 40 to 100 Ω·cm. In the case of electron beam deposition, the starting silicon material of the suitable resistivity is selected. In the case of sputtering, the resistivity of the target material is selected.

Figure 2A:
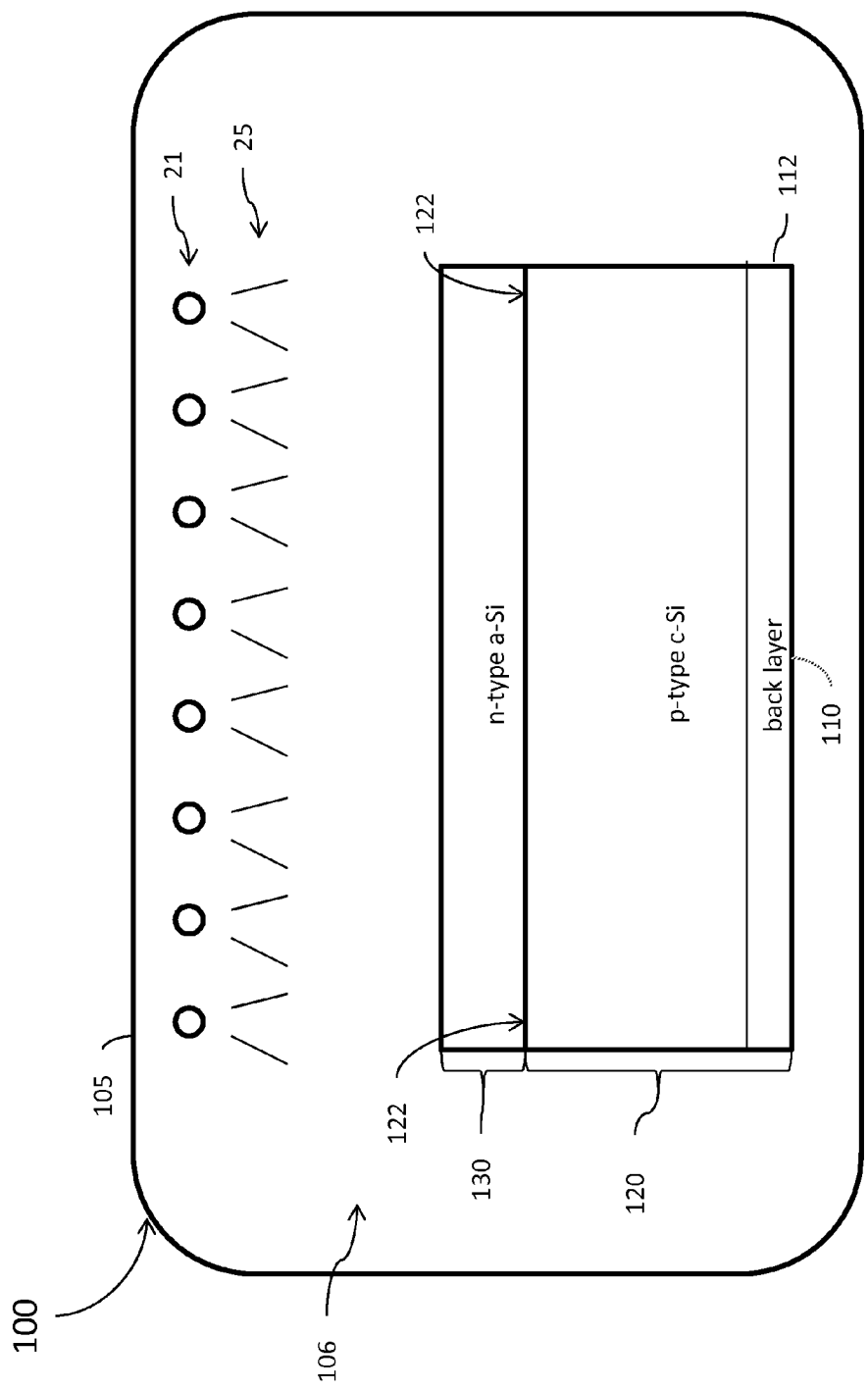
FIGS. 2A-2D are diagrams illustrating a process for fabricating a semiconductor device of one embodiment of the present disclosure.
Figure 2B:
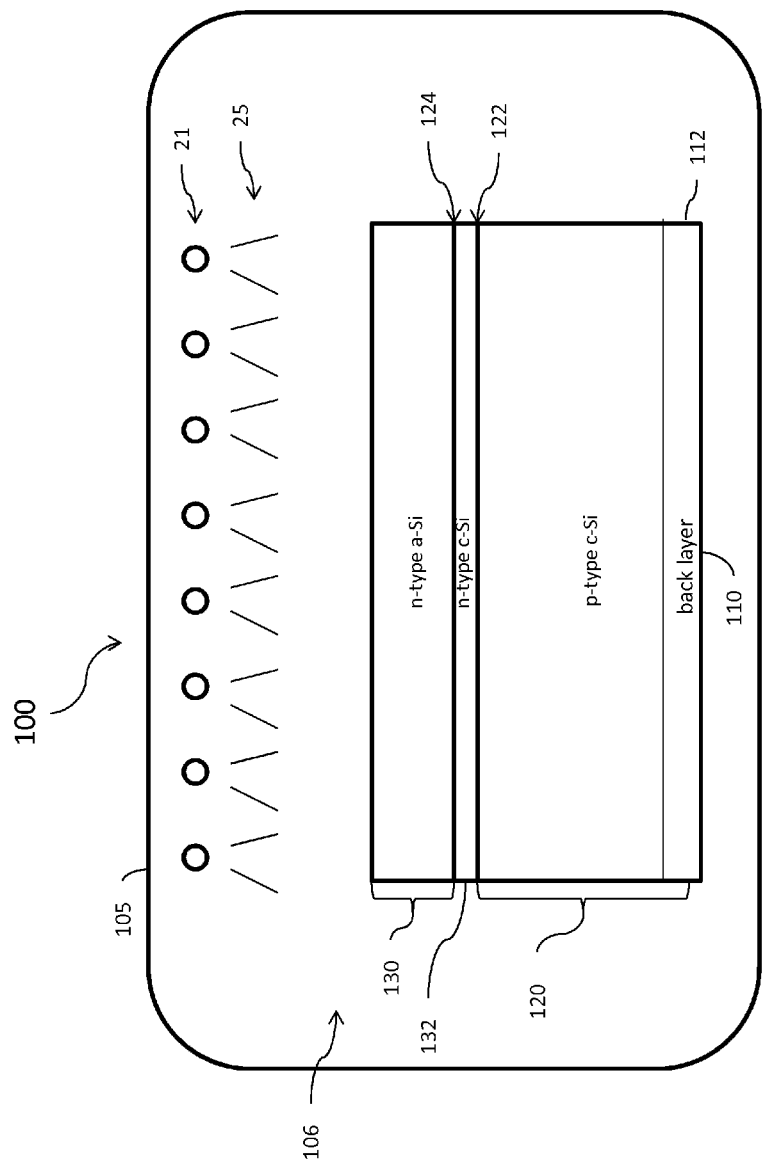
Figure 2C:
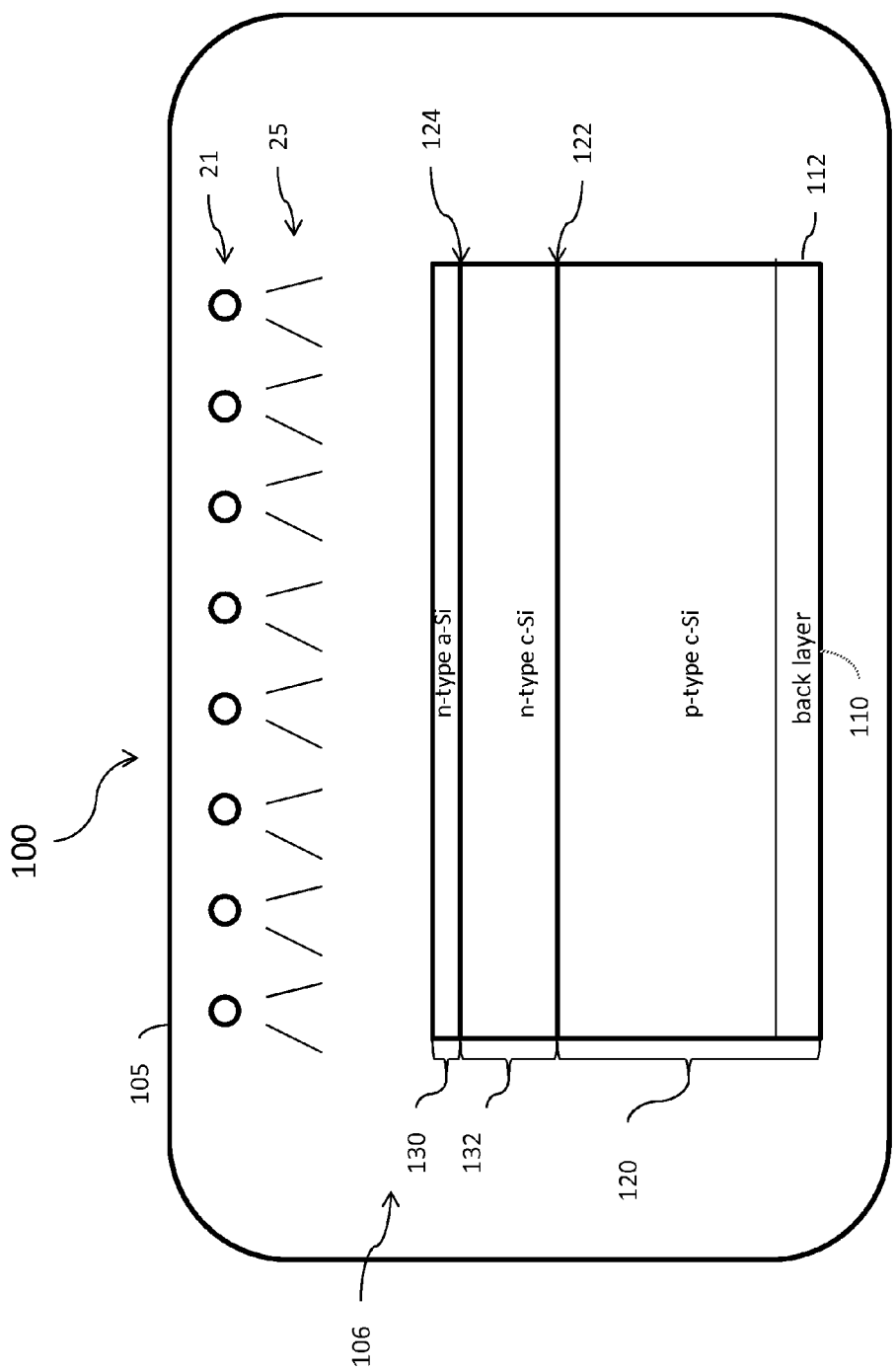
Figure 2D:
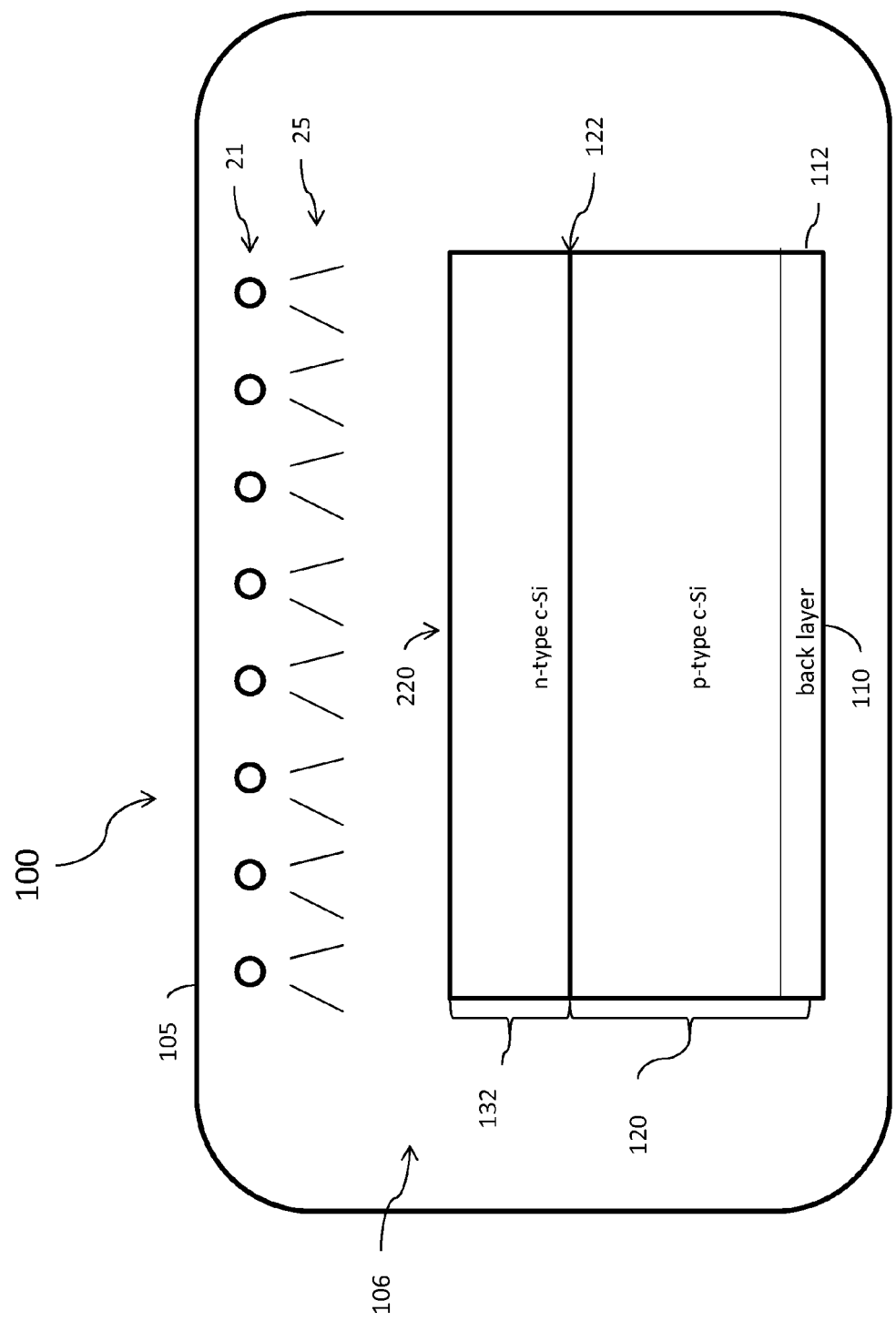

We have surmised that the underlying transformation taking place during optical processing of the amorphous semiconductor material layer 130 on the crystalline substrate 120 works as follows. Referring first to FIG. 2A, in this example embodiment, crystalline semiconductor base 120 comprises a p-type c-Si while amorphous semiconductor layer 130 comprises n-type a-Si. As discussed above, the optical energy 25 within the optical cavity furnace is tailored to a prescribed optical intensity profile that forms a uniform temperature distribution across semiconductor wafer 110 at the surface 122 of the p-type c-Si base 120. Surface 122 thus defines an initial interface between a-Si and c-Si material. The optical energy 25 penetrates through both the a-Si and c-Si material, but heats up the a-Si material faster, creating a small amount of a-Si interface melting between the a-Si and c-Si material (at surface 122). This a-Si interface melting facilitates epitaxial growth of the a-Si into a c-Si that has almost perfect crystal alignment with the c-Si lattice structure of the crystalline substrate 120. More specifically, as illustrated in FIG. 2B, once heated, a layer of the a-Si proximate to the interface with c-Si begins to assume an ordered crystalline structure that follows the structure upon which it is growing, thus itself becoming c-Si. Because c-Si is less able to absorb the optical energy 25 being applied than a-Si, once the amorphous material crystallizes, it expands and experiences a marginal cooling, and essentially "freezes" into a solid phase having the desired lattice structure of the base on which it froze. As a result, the location of the occurring interface melt relocates to the newly formed interface (shown at 124) between the remaining a-Si material and the newly crystallized c-Si material (shown at 132) which was previously a-Si. Illustrated by FIG. 2C, as this crystallization cycle continues, the layer 132 of n-type c-Si grows on base 120. Meanwhile, interface 124 continuously migrates away from surface 122 as the n-type a-Si material 130 depletes. Once the n-type a-Si material 130 is completely depleted (i.e., crystallized), as shown in FIG. 2D, the resulting structure comprises an entirely crystalline PN junction device 220.

In addition to the amorphous to epitaxial conversion just explained, during this process, another activity may be taking place. Some of the dopant (e.g., phosphorous) diffuses from the amorphous layer 130 into the crystalline base layer 120 material (likewise, some boron from the base layer 120 material may diffuse into the layers 132). However, the concentration of phosphorous in the formerly amorphous layers will remain much higher. This mechanism is a bit more effective at higher temperatures. But the overall effect of this mechanism is quite small, because the duration of the high-intensity stage 195 is relatively short.

Figure 3:
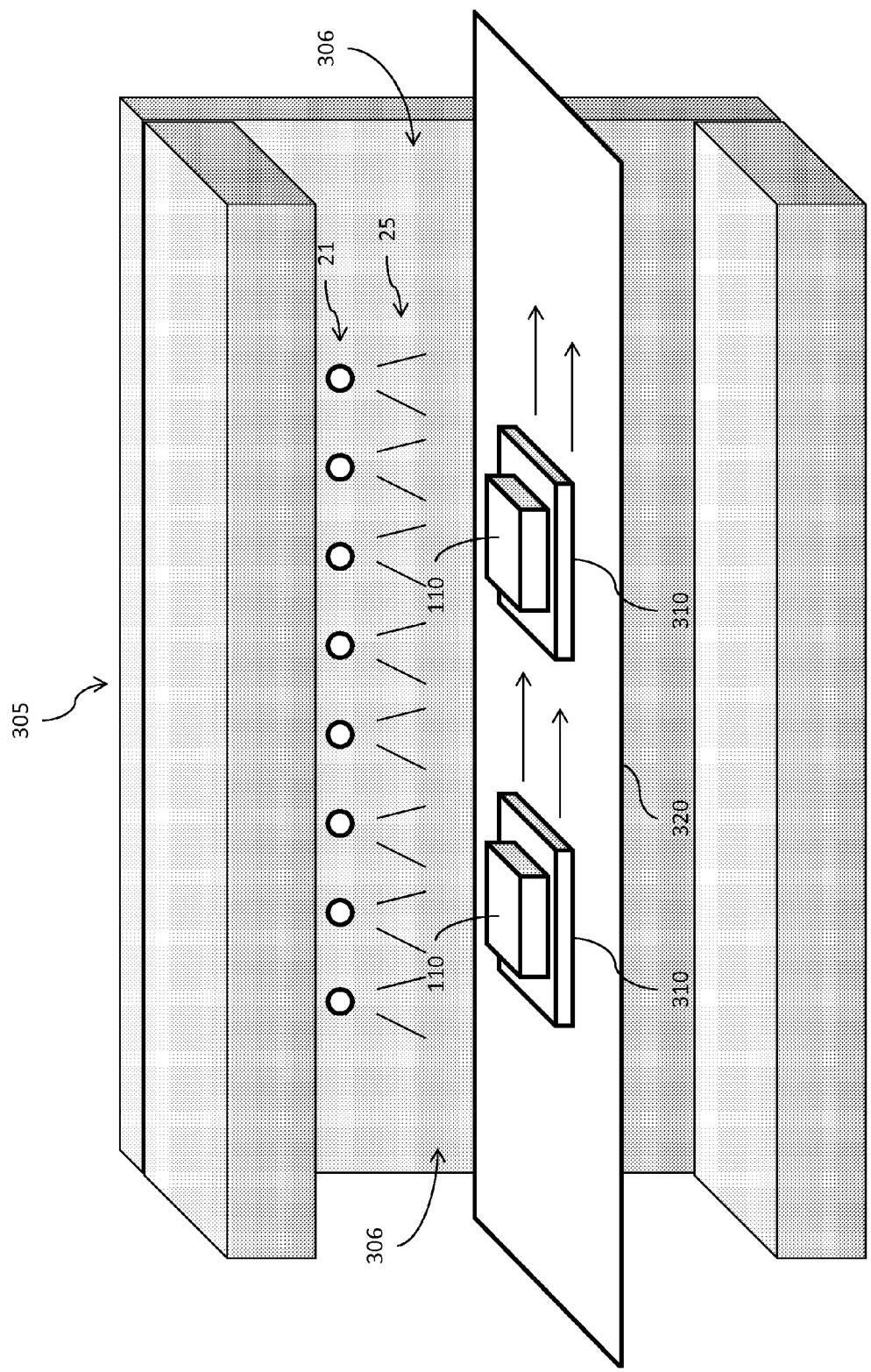
FIG. 3 is a diagram illustrating a process for fabricating a semiconductor device within an optical furnace of one embodiment of the present disclosure.

In other implementations, semiconductor wafer 110 may be loaded into a conveyor type optical furnace 305, an example of which is illustrated in FIG. 3. FIG. 3 illustrates a simplified cross-sectional of a conveyor type optical furnace 305 that include light sources 21 segmented into a plurality of regions, and each of which generate optical energy 25 having a prescribed and controlled intensity profile such as described above with respect to FIGS. 1, 1A and 1B. Within conveyor type optical furnace 305, semiconductor wafer 110 may be transported by a carrier 310 that travels through chamber 306 of optical furnace 305 via a conveyor device 320 (such as, but not limited to a conveyor belt or other motive mechanism). In such an implementation, both the light sources 21 and the conveyance speed of carrier 310 may be controlled to achieve having each semiconductor wafer 110 exposed to the desired intensity profile (such as shown in FIG. 1B). That is, the optical flux delivered by light sources 21 is controlled to produce a uniform temperature over each semiconductor wafer 110 traveling through optical furnace 305. In both the case of FIGS. 1A-C or FIG. 3, the a-Si layer 130 on semiconductor wafer 110 grows into a crystal phase over the course of the prescribed optical exposure. In both embodiments, the a-Si layer 130 grows epitaxially on the c-Si material, meaning that it's crystalline grown pattern produces a lattice structure that matches and is aligned to the lattice structure of crystalline semiconductor base 120.

The optical processing described above is typically performed with an argon or nitrogen ambient within the optical furnace. However, in one alternate embodiment, oxidation is introduced within the optical cavity furnace 105 (or 305) during the crystallization of the amorphous material. Oxidation may be introduced, for example, through a flow of either dry or wet $O_2$ into the chamber of the optical furnace. For such embodiments, the process further includes growing an oxide on the a-Si during at least some portion of the optical processing. It turns out that growing an oxide during the transformation of the a-Si to c-Si produces very interesting and unexpected benefits. For example, the average minority carrier lifetime within the resulting PN junction device can be maintained significantly longer (many milliseconds) versus the same resulting PN junction device where oxidation was not introduced during transformation of the a-Si to c-Si. Further, the resulting open circuit voltage under 1 sun of the resulting PN junction device will be higher versus the same resulting PN junction device where oxidation was not introduced. Impurities that may reside inside a furnace can diffuse into the a-Si layer, reducing the purity of the c-Si that is grown from the a-Si. When oxidation is applied, those impurities instead segregate into the oxide that is being formed rather than into the growing c-Si.

Figure 4:
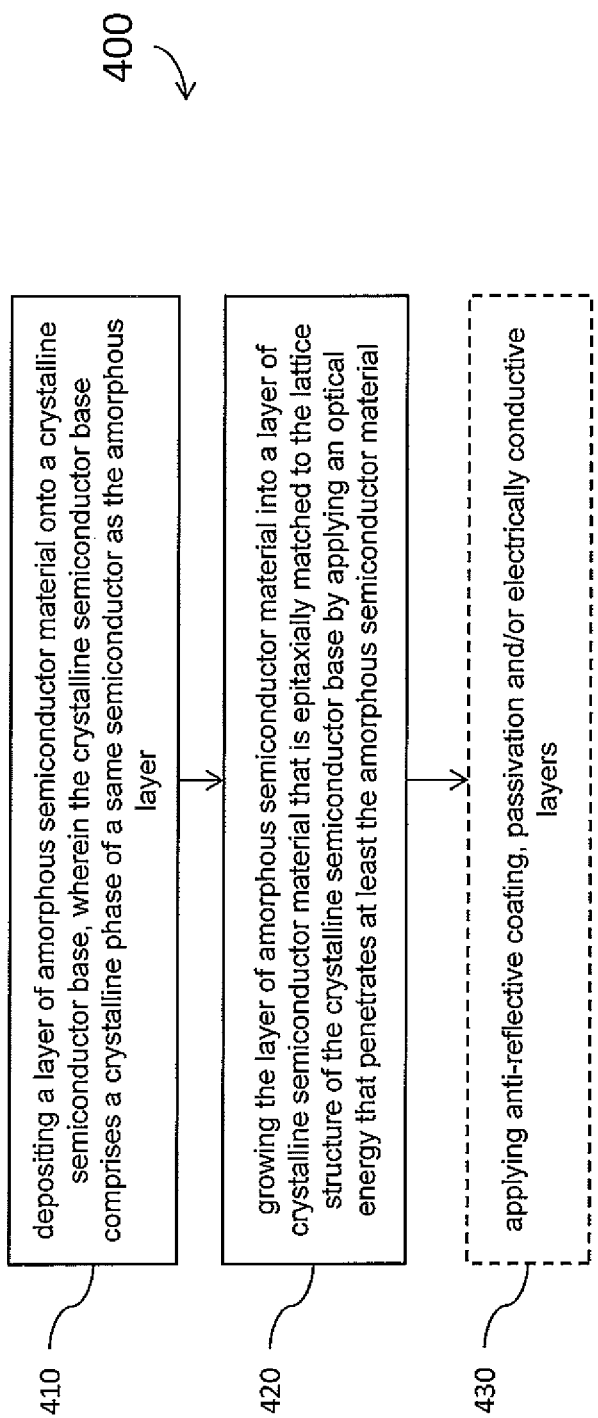
FIG. 4 is a flow chart illustrating a method for fabricating a semiconductor device within an optical furnace of one embodiment of the present disclosure.

FIG. 4 is a flow chat illustrating a method 400 of one embodiment of the present disclosure for optically growing a PN-Junction device from an amorphous semiconductor material. In alternate implementations, the method 400 can be combined with, or otherwise performed in conjunction with any of the embodiments or alternate implementations discussed above.

The method begins at 410 with depositing a layer of amorphous semiconductor material onto a crystalline semiconductor base, wherein the crystalline semiconductor base comprises a crystalline phase of a same semiconductor as the amorphous layer. For example, where the amorphous layer is a-Si (which is a Si material), then the crystalline semiconductor base also comprises Si material. Notwithstanding, the crystalline semiconductor base may further include other elements and thus possess a multi-crystalline structure. The crystalline semiconductor base may further include one or more back layers as described above. In alternate implementations, depositing a layer of amorphous semiconductor material may comprise deposition processes such as, but not limited to, electron beam deposition, Plasma-enhanced chemical vapor deposition (PECVD), sputtering, or hot-wire chemical vapor deposition (HWCVD). In yet other implementations, other deposition processes may be utilized to accomplish 410. In one or more implementations, the amorphous semiconductor material may be an n-type amorphous semiconductor material (such as n-type a-Si, for example) applied onto a surface of a p-type crystalline semiconductor base material (such as p-type c-Si, for example). Alternately, in other implementations, a p-type amorphous semiconductor material (such as p-type a-Si, for example) may be applied onto a surface of an n-type crystalline semiconductor base material (such as n-type c-Si, for example).

The method proceeds to 420 with growing the layer of amorphous semiconductor material into a layer of crystalline semiconductor material that is epitaxially matched to the lattice structure of the crystalline semiconductor base by applying an optical energy that penetrates at least the amorphous semiconductor material. The intensity profile of the optical energy may be controlled to produce a uniform heating along an interface within the semiconductor wafer between amorphous and crystalline semiconductor material. In one embodiment, the optical energy is applied at least until the amorphous semiconductor material is completely depleted (i.e., crystallized). As discussed above, growing the layer of amorphous semiconductor material into a layer of crystalline semiconductor material may be achieved within an optical cavity furnace where the semiconductor wafer remains stationary, where the semiconductor wafer is placed on a carrier within the optical furnace and moved through the optical furnace via a conveyor, or similar, mechanism. In either case, the optical energy may be provided by separately controlled regions of light sources (as described above with respect to FIG. 1B) each region having its own prescribed intensity profile (as described above with respect to FIG. 1C) in order to accomplish the uniform heating along the amorphous-crystalline material interface. The resulting structure comprises an entirely crystalline PN-junction device. In some embodiments, additional anti-reflective coating and passivation layers, as well electrically conductive layers, may be applied as part of the method (shown at block 430). The method 400 can also be repeated multiple times by iteratively depositing an additional layer of amorphous semiconductor material onto the crystallized material (i.e., returning to block 410) and growing the amorphous semiconductor material into crystallized material (i.e., proceeding again to block 420).

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

What is claimed is:

1. A method for fabricating an electrical device having a P-N junction, the method comprising:

depositing a layer of amorphous semiconductor material onto a crystalline semiconductor base, wherein the crystalline semiconductor base comprises a crystalline phase of a same semiconductor as the amorphous layer; and growing the layer of amorphous semiconductor material into a layer of crystalline semiconductor material that is epitaxially matched to a lattice structure of the crystalline semiconductor base by applying an optical energy that penetrates through at least the amorphous semiconductor material;

wherein the optical energy is controlled to penetrate the amorphous semiconductor material such as to produce uniform heating across an interfacing surface between the amorphous semiconductor material and the crystalline semiconductor base;

wherein the optical energy is applied in a single application to produce the uniform heating across the interfacing surface for a duration lasting until the amorphous semiconductor material is completely crystallized.

2. The method of claim 1, wherein an intensity profile of the optical energy is controlled to produce the uniform heating.

3. The method of claim 1, wherein the amorphous semiconductor material is amorphous silicon (a-Si) and the crystalline semiconductor base comprises a mono-crystalline silicon (c-Si).

4. The method of claim 1, wherein the crystalline semiconductor base comprises a multi-crystalline structure.

5. The method of claim 1, wherein the amorphous semiconductor material is an n-type semiconductor material and the crystalline semiconductor base comprises a p-type semiconductor material.

6. The method of claim 1, wherein depositing a layer of amorphous semiconductor material comprises at least one of, electron beam deposition, Plasma-enhanced chemical vapor deposition (PECVD), sputtering, or hot-wire chemical vapor deposition (HWCVD).

7. The method of claim 1, wherein the optical energy is provided by separately controlled regions of light sources, each region having its own prescribed intensity profile.

8. The method of claim 7, wherein the optical energy is controlled to produce the uniform heating by independently varying optical energy delivered by each region of light sources.

9. The method of claim 1, wherein the amorphous semiconductor material and the crystalline semiconductor base are conveyed through an optical furnace during application of the optical energy.

10. The method of claim 1, further comprising:
applying an anti-reflective coating after the amorphous semiconductor material is completely crystallized.

11. The method of claim 1, further comprising:
applying one or both of passivation layers and electrically conductive layers.

12. The method of claim 1, wherein the crystalline semiconductor base comprises one or more back layers.

13. The method of claim 12, wherein the one or more back layers comprise at least one aluminum (Al) back layer or at least one boron P+ back layer.

14. A method for fabricating an electrical device having a P-N junction, the method comprising:
placing a semiconductor wafer into an optical cavity furnace, wherein the semiconductor wafer comprises a layer of amorphous semiconductor material deposited onto a crystalline semiconductor base, and wherein the optical cavity furnace comprises:
a chamber configured to accept the semiconductor wafer; and
a plurality of light sources configured to apply optical energy into the chamber and onto the semiconductor wafer;
operating the plurality of light sources to generate an optical energy profile incident onto the amorphous semiconductor material that produces uniform heating across an interfacing surface within the semiconductor wafer between the amorphous semiconductor material and the crystalline semiconductor base; and
growing the layer of amorphous semiconductor material from the uniform heating at the interfacing surface into a layer of crystalline semiconductor material that is epitaxially matched to the lattice structure of the crystalline semiconductor base;
wherein the optical energy is controlled to penetrate at least the amorphous semiconductor material such as to produce the uniform heating; and
wherein the optical energy is applied in a single application to produce the uniform heating across the interfacing surface for a duration lasting until the amorphous semiconductor material is completely crystallized.

15. The method of claim 14, wherein the amorphous semiconductor material is amorphous silicon (a-Si) and the crystalline semiconductor base comprises a mono-crystalline silicon (c-Si).

16. The method of claim 14, wherein the crystalline semiconductor base comprises a multi-crystalline structure.

17. The method of claim 14, wherein the amorphous semiconductor material is an n-type semiconductor material and the crystalline semiconductor base comprises a p-type semiconductor material.

18. The method of claim 14, further comprising
depositing the layer of amorphous semiconductor material onto the crystalline semiconductor base.

19. The method of claim 14, wherein the optical energy is applied to the semiconductor wafer at least until the amorphous semiconductor material is completely transformed into the layer of crystalline semiconductor material.

20. The method of claim 14, wherein the optical energy is controlled to produce the uniform heating along the interfacing surface within the semiconductor wafer by independently varying optical energy delivered by respective segments of the plurality of light sources.

21. The method of claim 14, wherein the semiconductor wafer is placed on a carrier and conveyed through the optical cavity furnace during the application of the optical energy.

22. The method of claim 14, further comprising:
applying an anti-reflective coating after the layer of amorphous semiconductor material is completely crystallized; and
applying one or both of passivation layers and electrically conductive layers to the semiconductor wafer.

23. The method of claim 14, wherein the crystalline semiconductor base comprises one or more back layers.

24. The method of claim 23, wherein the one or more back layers comprise at least one aluminum (Al) back layer or at least one boron P+ back layer.

\* \* \* \* \*